United States Patent
Koshimizu

(10) Patent No.: US 12,020,899 B2
(45) Date of Patent: Jun. 25, 2024

(54) PLASMA PROCESSING APPARATUS AND PLASMA PROCESSING METHOD

(71) Applicant: Tokyo Electron Limited, Tokyo (JP)

(72) Inventor: Chishio Koshimizu, Miyagi (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 17/365,575

(22) Filed: Jul. 1, 2021

(65) Prior Publication Data
US 2022/0020567 A1    Jan. 20, 2022

(30) Foreign Application Priority Data
Jul. 15, 2020    (JP) ................................. 2020-121611

(51) Int. Cl.
*H01J 37/32* (2006.01)

(52) U.S. Cl.
CPC .. *H01J 37/32174* (2013.01); *H01J 37/32091* (2013.01); *H01J 37/32568* (2013.01); *H01J 37/32715* (2013.01); *H01J 2237/2007* (2013.01)

(58) Field of Classification Search
CPC ............ C23C 16/509; C23C 16/45587; C23C 16/515; H01J 2237/2007; H01J 37/32091; H01J 37/32146; H01J 37/32174; H01J 37/32532; H01J 37/32568; H01J 37/32642; H01J 37/32706; H01J 37/32715; H01J 37/32926

See application file for complete search history.

(56) References Cited

U.S. PATENT DOCUMENTS

| | | | | |
|---|---|---|---|---|
| 2006/0066247 | A1* | 3/2006 | Koshiishi | H01J 37/32834 315/111.21 |
| 2010/0220081 | A1* | 9/2010 | Yatsuda | H01J 37/32027 345/60 |
| 2010/0273332 | A1* | 10/2010 | Edelberg | H01L 21/31116 156/345.24 |
| 2014/0273487 | A1* | 9/2014 | Deshmukh | H01L 21/6875 156/345.43 |
| 2014/0299571 | A1* | 10/2014 | Sawataishi | H01J 37/32091 216/17 |
| 2018/0366305 | A1* | 12/2018 | Nagami | H01J 37/3299 |
| 2019/0057845 | A1* | 2/2019 | Nagami | H01J 37/32715 |

(Continued)

FOREIGN PATENT DOCUMENTS

JP    2012-009544 A    1/2012

*Primary Examiner* — Benjamin Kendall
*Assistant Examiner* — Joshua Reyes
(74) *Attorney, Agent, or Firm* — Studebaker & Brackett PC

(57) ABSTRACT

A disclosed plasma processing apparatus includes a chamber, a substrate support, a plasma generator, and first and second power sources. The first power source is configured to generate an electric bias and electrically connected to a lower electrode of the substrate support provided in the chamber. The second power source is configured to apply a positive voltage to a member in a first period that is a part of a whole period in which the electric bias output from the first power source to the lower electrode has a potential not less than an average potential of the electric bias within a cycle thereof. The member is disposed to be exposed to plasma generated in the chamber. The first power source is configured to output the electric bias having a positive potential to the lower electrode in a second period after the first period.

14 Claims, 7 Drawing Sheets

(56) References Cited

U.S. PATENT DOCUMENTS

2019/0122863 A1* 4/2019 Nagaseki .......... H01J 37/32091
2019/0198321 A1* 6/2019 Kihara ................... C23C 16/00
2020/0058470 A1    2/2020 Ventzek et al.

* cited by examiner

PLASMA PROCESSING APPARATUS AND PLASMA PROCESSING METHOD

CROSS-REFERENCE TO RELATED APPLICATIONS

This application is based on and claims the benefit of priority from Japanese Patent Application No. 2020-121611 filed on Jul. 15, 2020, the entire contents of which are incorporated herein by reference.

TECHNICAL FIELD

Exemplary embodiments of the present disclosure relate to a plasma processing apparatus and a plasma processing method.

BACKGROUND

In plasma processing, a substrate is processed using ions that are supplied from plasma. In general, the ions that are supplied to the substrate are positive ions. However, in addition to the positive ions, negative ions may be supplied to the substrate. Japanese Unexamined Patent Publication No. 2012-9544 discloses a technique for supplying, in addition to positive ions, negative ions to a substrate.

In the technique of Japanese Unexamined Patent Publication No. 2012-9544, the positive ions are supplied from plasma to the substrate when both a pulse wave of plasma radio frequency power and a pulse wave of bias radio frequency power are supplied. Negative ions are generated in the plasma when both of these pulse waves are stopped. The negative ions are supplied from the plasma to the substrate when the pulse wave of the plasma radio frequency power is stopped and the pulse wave of the bias radio frequency power is supplied.

SUMMARY

In an exemplary embodiment, a plasma processing apparatus is provided. The plasma processing apparatus is provided with a chamber, a substrate support, a plasma generator, a first power source, and a second power source. The substrate support has a lower electrode and is provided in the chamber. The plasma generator is configured to generate plasma from a gas in the chamber. The first power source is configured to generate an electric bias and electrically connected to the lower electrode. The second power source is configured to apply a positive voltage to a member that is exposed to the plasma generated in the chamber. The second power source is configured to apply the positive voltage to the member in a first period that is a part of a whole period in which the electric bias that is output from the first power source to the lower electrode has a potential equal to or higher than an average potential of the electric bias within a cycle thereof. The first power source is configured to output the electric bias having a positive potential to the lower electrode in a second period after the first period.

The foregoing summary is illustrative only and is not intended to be in any way limiting. In addition to the illustrative aspects, exemplary embodiments, and features described above, further aspects, exemplary embodiments, and features will become apparent by reference to the drawings and the following detailed description.

DETAILED DESCRIPTION

Figure 1:
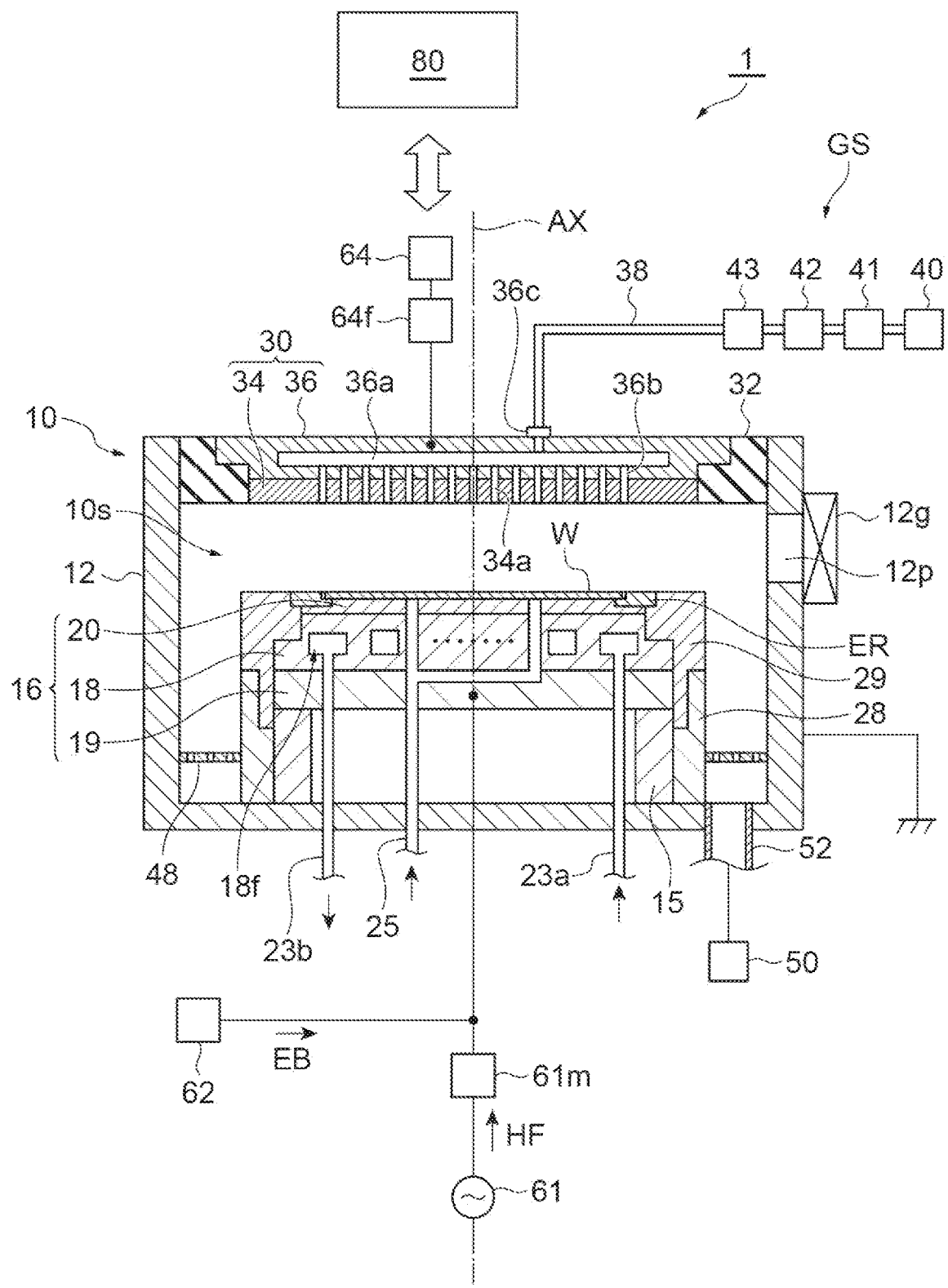
FIG. 1 schematically illustrates a plasma processing apparatus according to an exemplary embodiment.

Hereinafter, various exemplary embodiments will be described.

In an exemplary embodiment, a plasma processing apparatus is provided. The plasma processing apparatus is provided with a chamber, a substrate support, a plasma generator, a first power source, and a second power source. The substrate support has a lower electrode and is provided in the chamber. The plasma generator is configured to generate plasma from a gas in the chamber. The first power source is configured to generate an electric bias and electrically connected to the lower electrode. The second power source is configured to apply a positive voltage to a member that is exposed to the plasma generated in the chamber. The second power source is configured to apply the positive voltage to the member in a first period that is a part of a whole period in which the electric bias that is output from the first power source to the lower electrode has a potential equal to or higher than an average potential of the electric bias within a cycle thereof. The first power source is configured to output the electric bias having a positive potential to the lower electrode in a second period after the first period.

When the electric bias having a positive potential is applied to the lower electrode when plasma is present in the chamber, the electrons in the plasma reach the substrate support faster than the ions in the plasma. As a result, the potential of the lower electrode is neutralized and the intensity of the electric field for drawing negative ions into the substrate support is reduced. On the other hand, in the above embodiment, since the electric bias having a positive potential is applied to the lower electrode after the electrons in the plasma are drawn into the member that is exposed to the plasma, the negative ions in the plasma are efficiently supplied to the substrate on the substrate support.

In an exemplary embodiment, the plasma generator may be configured to stop supply of radio frequency power for plasma generation in the chamber or reduce a power level of the radio frequency power, at least in a period from a point in time of start of the first period to a point in time between a point in time of start and a point in time of end of the second period.

In an exemplary embodiment, a potential of the member in the first period may be higher than a potential of the lower electrode in the first period.

In an exemplary embodiment, the first power source may be configured to output the electric bias having a positive potential higher than a potential of the electric bias in the first period to the lower electrode in the second period.

In an exemplary embodiment, the plasma processing apparatus may be a capacitively coupled plasma processing apparatus.

In an exemplary embodiment, the plasma processing apparatus may be further provided with an upper electrode provided above the substrate support. The member may be the upper electrode.

In an exemplary embodiment, the first power source may be configured to periodically output a pulsed direct-current voltage or any voltage waveform as the electric bias.

In an exemplary embodiment, the first power source may be configured to output radio frequency power as the electric bias.

In another exemplary embodiment, a plasma processing method is provided. The plasma processing method include (a) generating plasma from a gas in a chamber of a plasma processing apparatus. The plasma processing apparatus includes a substrate support provided in the chamber. A first power source is electrically connected to a lower electrode in the substrate support. The plasma processing method further includes (b) applying a positive voltage from a second power source to a member that is exposed to the plasma, in a first period that is a part of a whole period in which an electric bias that is output from the first power source to the lower electrode has a potential equal to or higher than an average potential of the electric bias within a cycle thereof. The plasma processing method further includes (c) outputting the electric bias having a positive potential from the first power source to the lower electrode in a second period after the first period.

In an exemplary embodiment, at least in a period from a point in time of start of the first period to a point in time between a point in time of start and a point in time of end of the second period, supply of radio frequency power for plasma generation in the chamber may be stopped or a power level of the radio frequency power may be reduced.

Hereinafter, various exemplary embodiments will be described in detail with reference to the drawings. In the drawings, the same or equivalent portions are denoted by the same reference symbols.

FIG. 1 schematically illustrates a plasma processing apparatus according to an exemplary embodiment. A plasma processing apparatus 1 shown in FIG. 1 is a capacitively coupled plasma processing apparatus. The plasma processing apparatus 1 is provided with a chamber 10. The chamber 10 provides an internal space 10s therein. The central axis of the chamber 10 is an axis AX which extends in the vertical direction.

In an embodiment, the chamber 10 may include a chamber body 12. The chamber body 12 has a substantially cylindrical shape. The internal space 10s is provided in the chamber body 12. The chamber body 12 is formed of, for example, aluminum. The chamber body 12 is electrically grounded. A film having corrosion resistance is provided on the inner wall surface of the chamber body 12. The film having corrosion resistance may be a film formed of ceramic such as aluminum oxide or yttrium oxide.

A passage 12p is provided in a side wall of the chamber body 12. A substrate W passes through the passage 12p when it is transferred between the internal space 10s and the outside of the chamber 10. The passage 12p is made to be able to be opened and closed by a gate valve 12g. The gate valve 12g is provided along the side wall of the chamber body 12.

The plasma processing apparatus 1 is further provided with a substrate support 16. The substrate support 16 is configured to support the substrate W in the chamber 10. The substrate W may have a substantially disk shape. The substrate support 16 is supported by a support 15. The support 15 extends upward from a bottom portion of the chamber body 12. The support 15 has a substantially cylindrical shape. The support 15 is formed of an insulating material such as quartz.

The substrate support 16 includes a lower electrode 18. The substrate support 16 may further have an electrostatic chuck 20. The substrate support 16 may further include an electrode plate 19. The electrode plate 19 is formed of a conductive material such as aluminum. The electrode plate 19 has a substantially disk shape, and the central axis thereof is the axis AX. The lower electrode 18 is provided on the electrode plate 19. The lower electrode 18 is formed of a conductive material such as aluminum. The lower electrode 18 has a substantially disk shape, and the central axis thereof is the axis AX. The lower electrode 18 is electrically connected to the electrode plate 19.

A flow path 18f is provided in the lower electrode 18. The flow path 18f is connected to a supply device for a heat exchange medium (for example, a chiller unit). The supply device is provided outside the chamber 10. The flow path 18f receives the heat exchange medium that is supplied from the supply device through a pipe 23a. The heat exchange medium flows through the flow path 18f and is then returned to the supply device through a pipe 23b. The supply device configures a temperature adjusting mechanism of the plasma processing apparatus 1.

The electrostatic chuck 20 is provided on the lower electrode 18. The substrate W is placed on the upper surface of the electrostatic chuck 20. The electrostatic chuck 20 has a main body and an electrode. The main body is formed of a dielectric. Each of the electrostatic chuck 20 and the main body thereof has a substantially disk shape, and the central axis thereof is the axis AX. The electrode is a film having electrical conductivity and is provided in the main body. The electrode is connected to a direct-current power source through a switch. When the voltage of the direct-current power source is applied to the electrode, an electrostatic attraction force is generated between the electrostatic chuck 20 and the substrate W. Due to the generated electrostatic attraction force, the substrate W is attracted to the electrostatic chuck 20 and held by the electrostatic chuck 20.

The substrate support 16 may support an edge ring ER that is mounted on the peripheral edge portion thereof. The edge ring ER may be formed of silicon, silicon carbide, or quartz. The substrate W is disposed on the electrostatic chuck 20 and in a region surrounded by the edge ring ER.

The plasma processing apparatus 1 may be further provided with a gas supply line 25. The gas supply line 25 supplies a heat transfer gas (for example, a He gas) from a gas supply mechanism to a gap between the upper surface of the electrostatic chuck 20 and the rear surface (lower surface) of the substrate W.

The plasma processing apparatus 1 may be further provided with a tubular part 28 and an insulating part 29. The tubular part 28 extends upward from the bottom portion of the chamber body 12. The tubular part 28 extends along the outer periphery of the support 15. The tubular part 28 is formed of a conductive material and has a substantially cylindrical shape. The tubular part 28 is electrically grounded. The insulating part 29 is provided on the tubular part 28. The insulating part 29 is formed of a material having insulation properties. The insulating part 29 is formed of ceramic such as quartz, for example. The insulating part 29 has a substantially cylindrical shape. The insulating part 29 extends along the outer periphery of the electrode plate 19, the outer periphery of the lower electrode 18, and the outer periphery of the electrostatic chuck 20.

The plasma processing apparatus 1 is further provided with an upper electrode 30. The upper electrode 30 is provided above the substrate support 16. The upper electrode 30 is supported on an upper portion of the chamber body 12 through a member 32. The member 32 is formed of a material having insulation properties. The upper electrode 30 and the member 32 close the upper opening of the chamber body 12.

The upper electrode 30 may include a ceiling plate 34 and a support 36. The lower surface of the ceiling plate 34 is a lower surface on the internal space 10s side and defines the internal space 10s. The ceiling plate 34 may be formed of a low resistance conductor or semiconductor with low Joule heat. In an embodiment, the ceiling plate 34 is formed of silicon. A plurality of gas discharge holes 34a are provided in the ceiling plate 34. The plurality of gas discharge holes 34a penetrate the ceiling plate 34 in a plate thickness direction thereof.

The support 36 detachably supports the ceiling plate 34. The support 36 is formed of a conductive material such as aluminum. The support 36 provides a gas diffusion chamber 36a therein. The support 36 is further provided with a plurality of gas holes 36b. The plurality of gas holes 36b extend downward from the gas diffusion chamber 36a. The plurality of gas holes 36b communicate with the plurality of gas discharge holes 34a, respectively. The support 36 is further provided with a gas introduction port 36c. The gas introduction port 36c is connected to the gas diffusion chamber 36a. A gas supply pipe 38 is connected to the gas introduction port 36c.

A gas source group 40 is connected to the gas supply pipe 38 through a valve group 41, a flow rate controller group 42, and a valve group 43. The gas source group 40, the valve group 41, the flow rate controller group 42, and the valve group 43 configure a gas supply unit GS. The gas source group 40 includes a plurality of gas sources. The plurality of gas sources of the gas source group 40 include sources of a plurality of gases. Each of the valve group 41 and the valve group 43 includes a plurality of on-off valves. The flow rate controller group 42 includes a plurality of flow rate controllers. Each of the plurality of flow rate controllers of the flow rate controller group 42 is a mass flow controller or a pressure control type flow rate controller. Each of the plurality of gas sources of the gas source group 40 is connected to the gas supply pipe 38 through a corresponding on-off valve of the valve group 41, a corresponding flow rate controller of the flow rate controller group 42, and a corresponding on-off valve of the valve group 43.

The plasma processing apparatus 1 may be further provided with a baffle member 48. The baffle member 48 is provided between the tubular part 28 and the side wall of the chamber body 12. The baffle member 48 may be a plate-shaped member. The baffle member 48 is configured, for example, by forming a film having corrosion resistance on the surface of a member made of aluminum. The film having corrosion resistance may be a film formed of ceramic such as yttrium oxide. A plurality of through-holes are provided in the baffle member 48. An exhaust port is provided in the bottom portion of the chamber body 12 below the baffle member 48. An exhaust device 50 is connected to the exhaust port through an exhaust pipe 52. The exhaust device 50 has a pressure adjusting valve, and a vacuum pump such as a turbo molecular pump.

The plasma processing apparatus 1 is further provided with a radio frequency power source 61. The radio frequency power source 61 is a power source that generates radio frequency power HF for plasma generation. The radio frequency power HF has a first frequency. The first frequency is a frequency in the range of 27 to 100 MHz, for example. The radio frequency power source 61 is connected to the lower electrode 18 through a matcher 61m and the electrode plate 19 in order to supply the radio frequency power HF to the lower electrode 18. The matcher 61m has a matching circuit. The matching circuit of the matcher 61m has variable impedance. The impedance of the matching circuit of the matcher 61m is adjusted to reduce the reflection from a load of the radio frequency power source 61. The radio frequency power source 61 may not be electrically connected to the lower electrode 18, and may be connected to the upper electrode 30 through the matcher 61m. The radio frequency power source 61 configures a plasma generator of an embodiment.

The plasma processing apparatus 1 is further provided with a bias power source 62. The bias power source 62 configures a first power source of an embodiment. The bias power source 62 is connected to the lower electrode 18 through the electrode plate 19 and is configured to generate an electric bias EB. The electric bias EB that is applied from the bias power source 62 to the lower electrode 18 changes the potential of the substrate W.

In an embodiment, the bias power source 62 is configured to periodically output a pulsed direct-current voltage or any voltage waveform as the electric bias EB. A second frequency, which defines a cycle CY (refer to FIG. 2) of the electric bias EB, is lower than the first frequency. The second frequency is the reciprocal of the time length of the cycle CY. The second frequency is, for example, a frequency in the range of 1 kHz to 27 MHz. In this embodiment, the bias power source 62 is configured to apply the electric bias EB that includes a pulse of a negative direct-current voltage and a pulse of a positive direct-current voltage to the lower electrode 18.

The plasma processing apparatus 1 is further provided with a power source 64. The power source 64 configures a second power source of an embodiment. The power source 64 is electrically connected to the member 60 and is configured to apply a voltage to the member 60. The member 60 is disposed to be exposed to the plasma that is generated in the chamber 10. In an embodiment, the member 60 is the upper electrode 30, and the power source 64 is electrically connected to the upper electrode 30.

Figure 2:
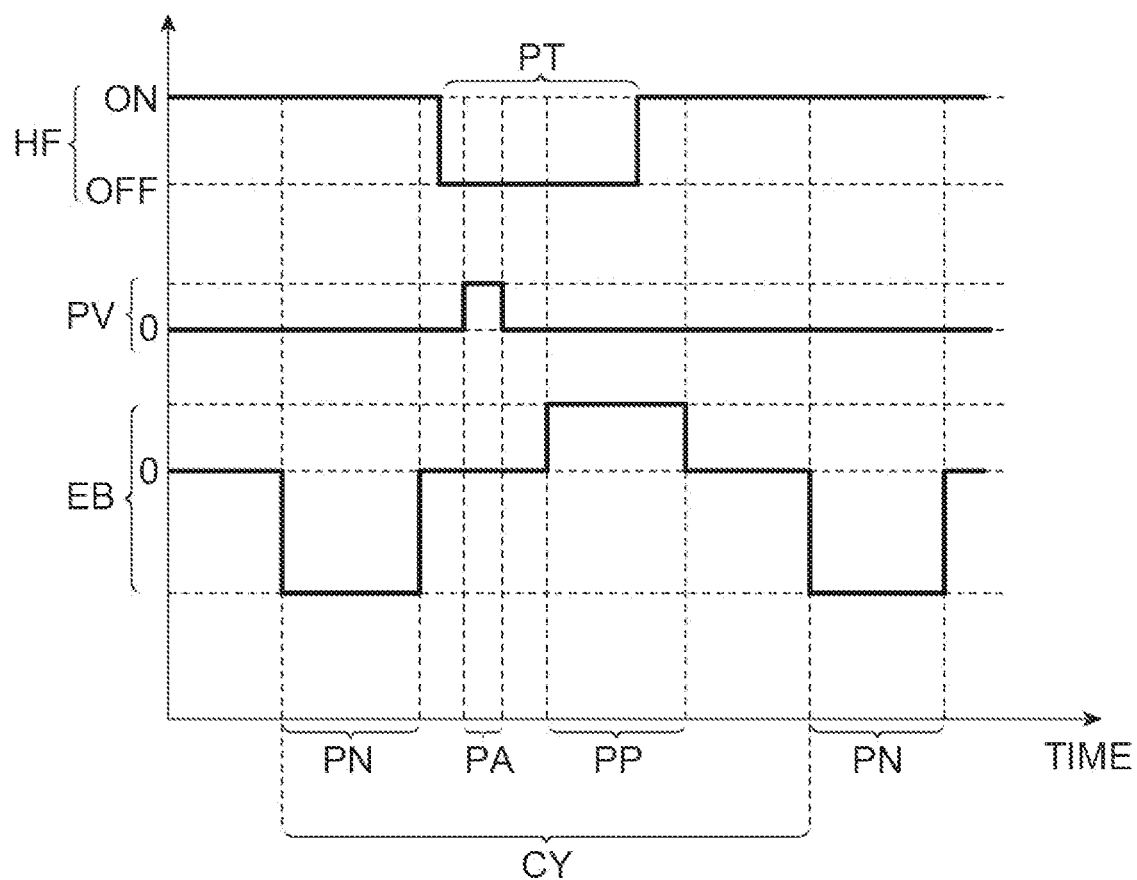
FIG. 2 is a timing chart related to the plasma processing apparatus according to an exemplary embodiment.

Hereinafter, FIG. 2 will be referred to together with FIG. 1. FIG. 2 is a timing chart related to the plasma processing apparatus according to an exemplary embodiment. In FIG. 2, the horizontal axis represents time. "HF" on the vertical axis of FIG. 2 represents that the radio frequency power HF is supplied when the HF is ON, and the supply of the radio frequency power HF is stopped when the HF is OFF. "PV" on the vertical axis of FIG. 2 represents a voltage that is applied to the member 60 by the power source 64. "EB" on the vertical axis of FIG. 2 represents the electric bias EB.

In the plasma processing apparatus 1, plasma is generated from the gas in the chamber 10 in a period in which the radio frequency power HF is supplied. The bias power source 62 outputs the electric bias EB having a negative potential to the lower electrode 18 in a period PN in the cycle CY. In the period PN, the positive ions in the plasma are supplied to the substrate W.

The power source 64 applies a positive voltage to the member 60 in a period PA (that is, a first period) in the cycle CY. The period PA is a period that is a part of the whole period in which the electric bias EB that is output from the bias power source 62 to the lower electrode 18 has a potential equal to or higher than the average potential of the electric bias EB within the cycle CY (one cycle) thereof. The period PA is, for example, a period in which the electric bias EB that is output from the bias power source 62 to the lower electrode 18 has 0 or a positive potential. In an embodiment, the potential of the member 60 in the period PA may be set to a potential higher than the potential of the lower electrode 18 in the period PA. When a positive voltage is applied to the member 60 in the period PA, the electrons in the plasma are attracted to the member 60. The time length of the period PA is set to be able to attract the electrons in the plasma to the member 60 and suppress a decrease in the amount of negative ions in the plasma. The time length of the period PA may be 1 μsec or less, or may be 0.2 μsec or less.

The bias power source 62 outputs the electric bias EB having a positive potential to the lower electrode 18 in a period PP (that is, a second period) after the period PA in the cycle CY. The time length of the period PP may be 0.05 μsec or more and 5 μsec or less. In an embodiment, the bias power source 62 may output the electric bias EB having a positive potential higher than the potential of the electric bias EB in the period PA to the lower electrode 18. The electrons in the plasma are almost lost in the period PA. Therefore, in the period PP, the negative ions in the plasma are supplied to the substrate W.

The radio frequency power source 61, that is, the plasma generator, may be configured to stop the supply of the radio frequency power HF for plasma generation in the chamber 10 or reduce the power level of the radio frequency power HF, in a period PT. The period PT includes at least a period from the point in time of start of the period PA to the point in time between the point in time of start and the point in time of end of the period PP. In an example, the period PT is a period from the point in time between the point in time of end of the period PN and the point in time of start of the period PA to the point in time between the point in time of start and the point in time of end of the period PP.

When the electric bias EB having a positive potential is applied to the lower electrode 18 when plasma is present in the chamber 10, the electrons in the plasma reach the substrate support 16 faster than the ions in the plasma. As a result, the potential of the lower electrode 18 is neutralized, and the intensity of the electric field for drawing negative ions into the substrate support 16 becomes smaller. On the other hand, in the plasma processing apparatus 1, since the electric bias EB having a positive potential is applied to the lower electrode 18 after the electrons in the plasma are drawn into the member 60 that is exposed to the plasma, the negative ions in the plasma are efficiently supplied to the substrate W on the substrate support 16.

As shown in FIG. 1, the plasma processing apparatus 1 is further provided with a controller 80. The controller 80 is a computer which includes a processor, a storage device, an input device, a display device, and the like, and controls each part of the plasma processing apparatus 1. Specifically, the controller 80 executes a control program stored in the storage device and controls each part of the plasma processing apparatus 1, based on recipe data stored in the storage device. A process designated by the recipe data is performed in the plasma processing apparatus 1 under the control by the controller 80. The timing control of the radio frequency power HF, the voltage PV, and the electric bias EB as shown in the timing chart of FIG. 2 is performed by the control of the radio frequency power source 61, the power source 64, and the bias power source 62 by the controller 80.

Figure 3:
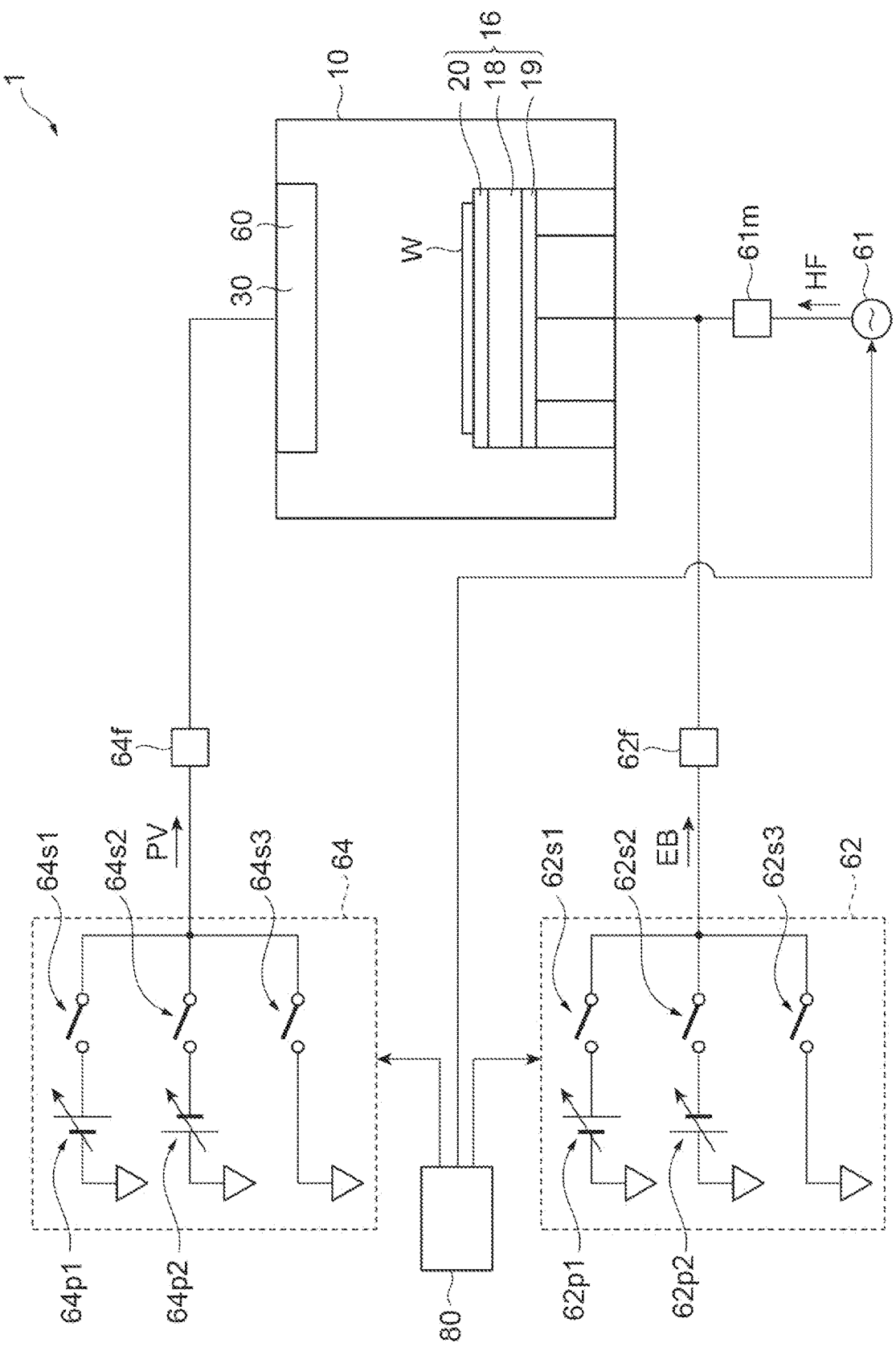
FIG. 3 schematically illustrates an electrical configuration of the plasma processing apparatus according to an exemplary embodiment.

Hereinafter, FIG. 3 will be referred to. FIG. 3 schematically illustrates an electrical configuration of the plasma processing apparatus according to an exemplary embodiment. In an embodiment, the plasma processing apparatus 1 may have the configuration shown in FIG. 3 for the timing control of the radio frequency power HF, the voltage PV, and the electric bias EB as shown in the timing chart of FIG. 2.

As shown in FIG. 3, the bias power source 62 may be connected to the lower electrode 18 through a filter 62f. The filter 62f is a low-pass filter and reduces the radio frequency power HF that may flow into the bias power source 62.

The bias power source 62 may include a direct-current power source 62p1, a direct-current power source 62p2, a switch 62s1, a switch 62s2, and a switch 62s3. Each of the direct-current power source 62p1 and the direct-current power source 62p2 may be a variable direct-current power source. The positive electrode of the direct-current power source 62p1 is connected to the lower electrode 18 through the switch 62s1. The negative electrode of the direct-current power source 62p1 is connected to the ground. The negative electrode of the direct-current power source 62p2 is connected to the lower electrode 18 through the switch 62s2. The positive electrode of the direct-current power source 62p2 is connected to the ground. The switch 62s3 is connected between the ground and the lower electrode 18. The variable direct-current power source configuring each of the direct-current power source 62p1 and the direct-current power source 62p2 may be a direct-current power source in which the positive electrode and negative electrode thereof can be set optionally. Further, the switch 62s1, the switch 62s2, and the switch 62s3 may be connected to the lower electrode 18 through the respective separate filters, instead of the single filter 62f.

The opening and closing of each of the switch 62s1, the switch 62s2, and the switch 62s3 can be controlled by the controller 80. When the switch 62s1 is closed and the switch 62s2 and the switch 62s3 are opened, the positive voltage from the direct-current power source 62p1 is output to the lower electrode 18. When the switch 62s2 is closed and the switch 62s1 and the switch 62s3 are opened, the negative voltage from the direct-current power source 62p2 is output to the lower electrode 18. When the switch 62s3 is closed and the switch 62s1 and the switch 62s2 are opened, the lower electrode 18 is connected to the ground.

As shown in FIG. 3, the power source 64 may be connected to the member 60 through a filter 64f. The filter 64f is a low-pass filter and reduces radio frequency power that may flow into the power source 64.

The power source 64 may include a direct-current power source 64p1, a direct-current power source 64p2, a switch 64s1, a switch 64s2, and a switch 64s3. Each of the direct-current power source 64p1 and the direct-current power source 64p2 may be a variable direct-current power source. The positive electrode of the direct-current power source 64p1 is connected to the member 60 through the switch 64s1. The negative electrode of the direct-current power source 64p1 is connected to the ground. The negative electrode of the direct-current power source 64p2 is connected to the member 60 through the switch 64s2. The positive electrode of the direct-current power source 64p2 is connected to the ground. The switch 64s3 is connected between the ground and the member 60. The power source 64 does not need to have the direct-current power source 64p2 and the switch 64s2. The variable direct-current power source configuring each of the direct-current power source 64p1 and the direct-current power source 64p2 may be a direct-current power source in which the positive electrode and negative electrode thereof can be set optionally. Further, the switch 64s1, the switch 64s2, and the switch 64s3 may be connected to the member 60 through respective separate filters, instead of the single filter 64f.

The opening and closing of each of the switch 64s1, the switch 64s2, and the switch 64s3 can be controlled by the controller 80. When the switch 64s1 is closed and the switch 64s2 and the switch 64s3 are opened, the positive voltage from the direct-current power source 64p1 is applied to the member 60. When the switch 64s2 is closed and the switch 64s1 and the switch 64s3 are opened, the negative voltage from the direct-current power source 64p2 is applied to the member 60. When the switch 64s3 is closed and the switch 64s1 and the switch 64s2 are opened, the member 60 is connected to the ground.

Figure 4:
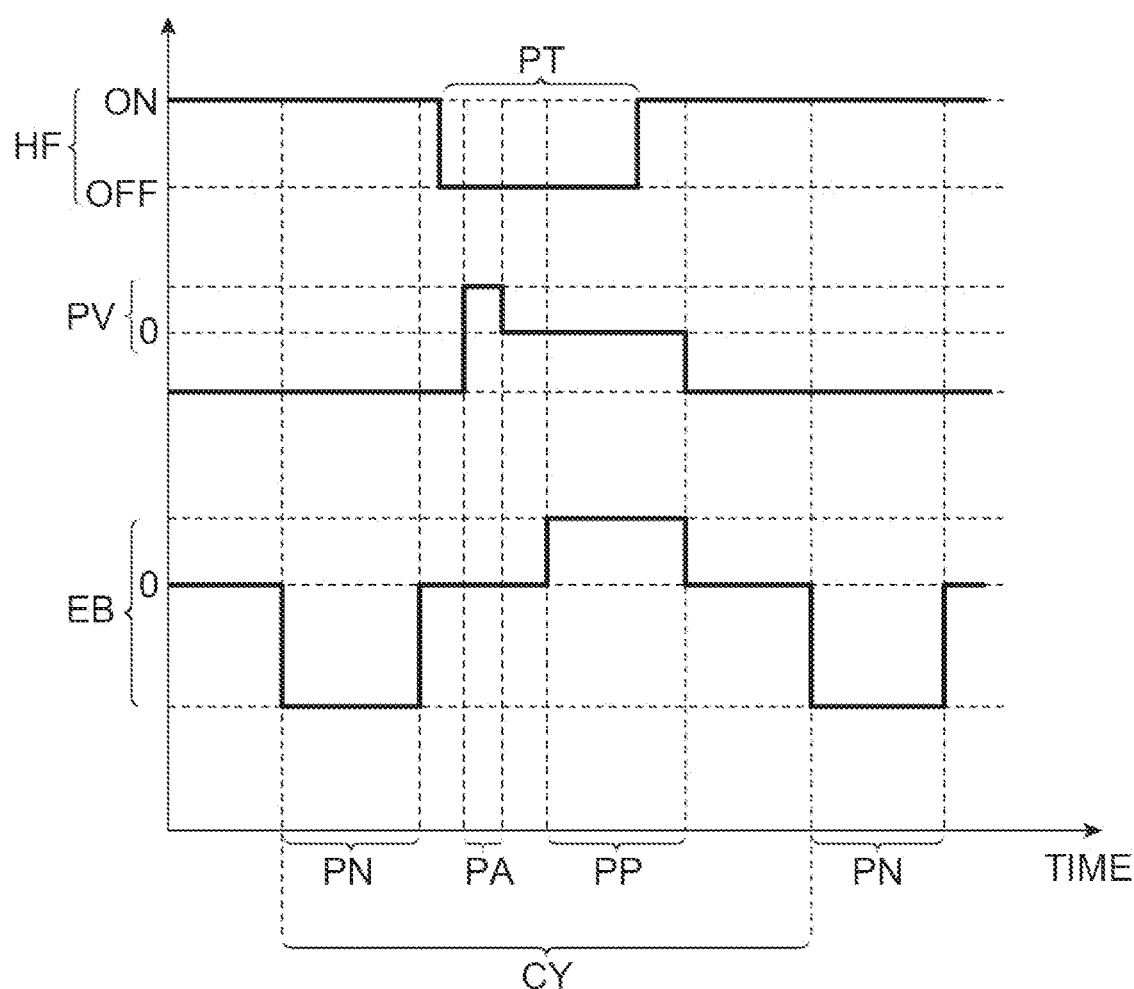
FIG. 4 is another timing chart related to the plasma processing apparatus according to an exemplary embodiment.

Hereinafter, FIG. 4 will be referred to. FIG. 4 is another timing chart related to the plasma processing apparatus according to an exemplary embodiment. The plasma processing apparatus 1 may perform the timing control of the radio frequency power HF, the voltage PV, and the electric bias EB, as in the timing chart shown in FIG. 4. Specifically, the power source 64 may apply a negative voltage to the member 60 in a period excluding the period from the point in time of start of the period PA to the point in time of end of the period PP within the cycle CY.

Figure 5:
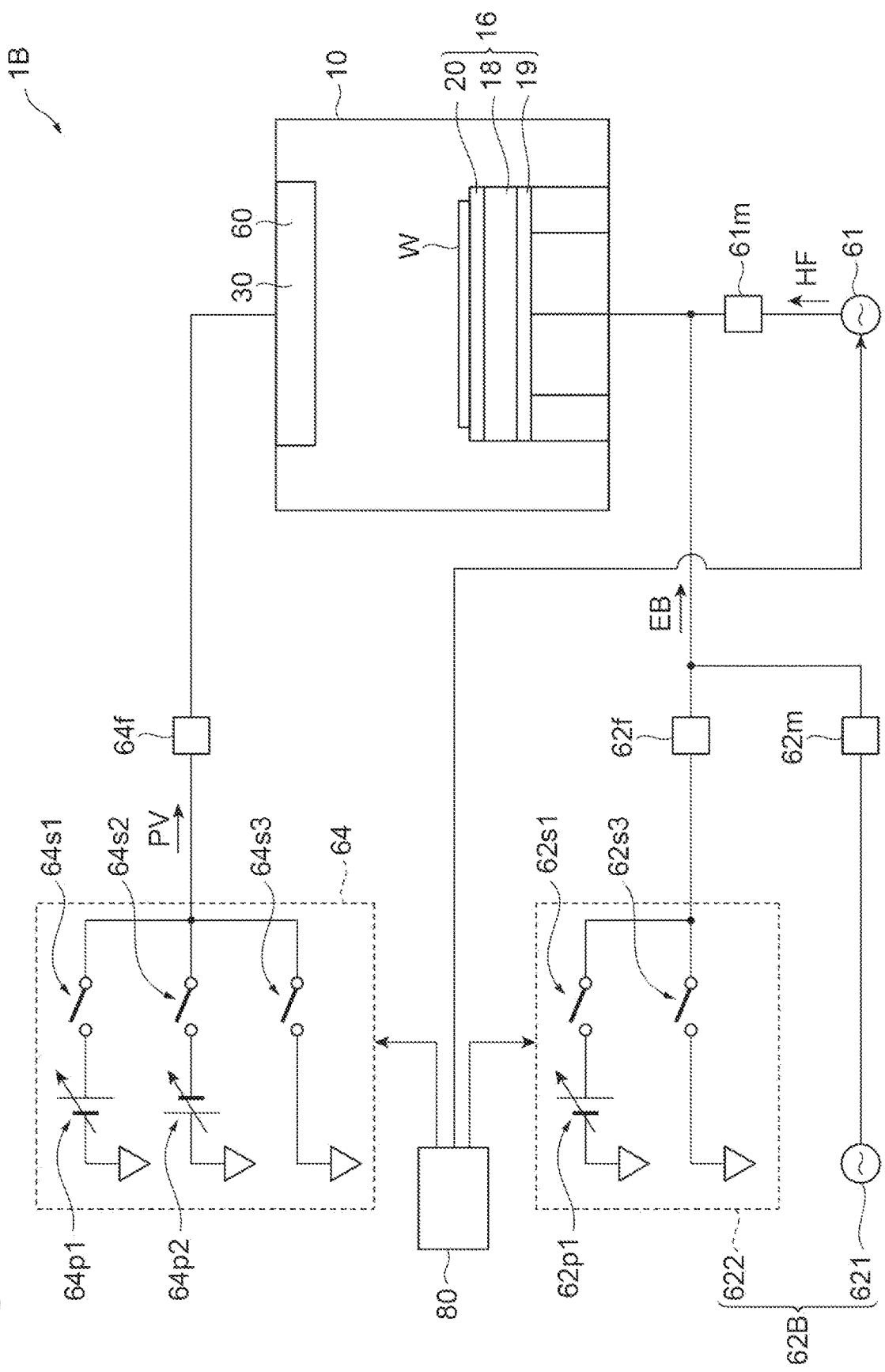
FIG. 5 schematically illustrates an electrical configuration of a plasma processing apparatus according to another exemplary embodiment.
Figure 6:
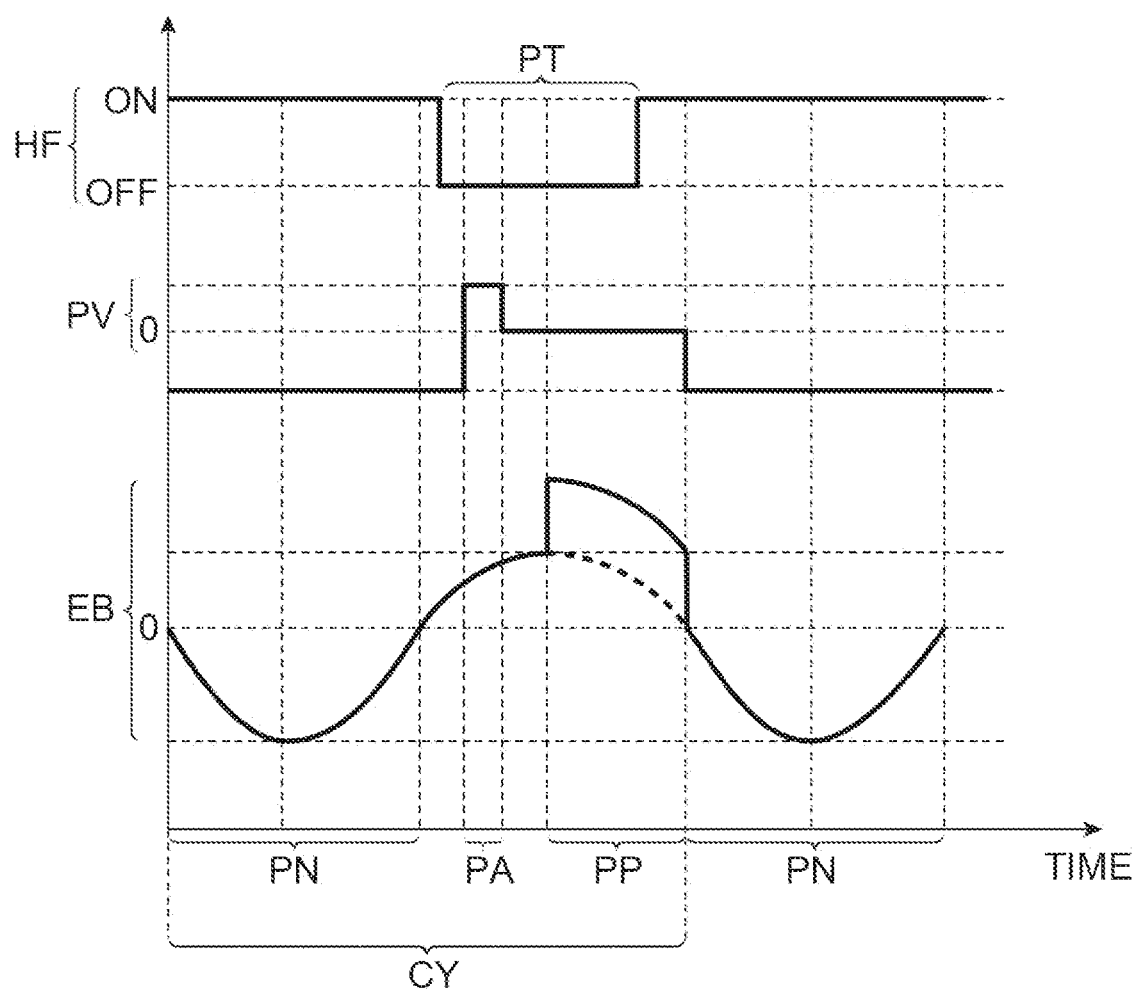
FIG. 6 is a timing chart related to the plasma processing apparatus according to another exemplary embodiment.

Hereinafter, FIGS. 5 and 6 will be referred to. FIG. 5 schematically illustrates an electrical configuration of a plasma processing apparatus according to another exemplary embodiment. FIG. 6 is a timing chart related to the plasma processing apparatus according to another exemplary embodiment. A plasma processing apparatus 1B shown in FIG. 5 is different from the plasma processing apparatus 1 in that the plasma processing apparatus 1B is provided with a bias power source 62B instead of the bias power source 62. Hereinafter, the plasma processing apparatus 1B will be described from the viewpoint of the differences from the plasma processing apparatus 1. Except for the points described below, the configurations of the plasma processing apparatus 1B may be the same as the corresponding configurations of the plasma processing apparatus 1.

The bias power source 62B may output, as the electric bias EB, radio frequency power (that is, radio frequency bias power) to the lower electrode 18. The electric bias EB, that is, the radio frequency power, which is output by the bias power source 62B has a second frequency. The second frequency is, for example, a frequency in the range of 100 kHz to 27 MHz. As shown in FIG. 6, the electric bias EB that is output from the bias power source 62B to the lower electrode 18 has a negative potential in the period PN in the cycle CY, and has 0 or positive potential in the period excluding the period PN in the cycle CY.

As shown in FIG. 5, the bias power source 62B may have a radio frequency power source 621 and a power source 622. The radio frequency power source 621 is configured to generate radio frequency power having the second frequency. The radio frequency power source 621 is connected to the lower electrode 18 through a matcher 62m and the electrode plate 19. The matcher 62m has a matching circuit. The matching circuit of the matcher 62m has variable impedance. The impedance of the matching circuit of the matcher 62m is adjusted to reduce the reflection from a load of the bias power source 62.

As shown in FIG. 5, the power source 622 may be connected to the lower electrode 18 through the filter 62f.

The filter 62f is a low-pass filter and reduces the radio frequency power HF that may flow into the power source 622.

The power source 622 may have the direct-current power source 62p1, the switch 62s1, and the switch 62s3. The direct-current power source 62p1 may be a variable direct-current power source. The positive electrode of the direct-current power source 62p1 is connected to the lower electrode 18 through the switch 62s1. The negative electrode of the direct-current power source 62p1 is connected to the ground. The switch 62s3 is connected between the ground and the lower electrode 18. The variable direct-current power source configuring the direct-current power source 62p1 may be a direct-current power source in which the positive electrode and negative electrode thereof can be set optionally. Further, the switch 62s1 and the switch 62s3 may be connected to the lower electrode 18 through respective separate filters, instead of the single filter 62f.

The opening and closing of each of the switches 62s1 and 62s3 can be controlled by the controller 80. When the switch 62s1 is closed and the switch 62s3 is opened, the positive voltage from the direct-current power source 62p1 is output to the lower electrode 18. When the switch 62s3 is closed and the switch 62s1 is opened, the lower electrode 18 is connected to the ground.

In order to generate the electric bias EB shown in FIG. 6, the switches 62s1 and 62s3 are opened in a period excluding the period PP. Therefore, in the period excluding the period PP, only the radio frequency power from the radio frequency power source 621 is supplied to the lower electrode 18 as the electric bias EB. In the period PP, the switch 62s1 is closed and the switch 62s3 is opened. Therefore, in the period PP, the electric bias EB generated by superimposing the radio frequency power from the radio frequency power source 621 and the positive voltage from the power source 622 is supplied to the lower electrode 18.

Figure 7A:
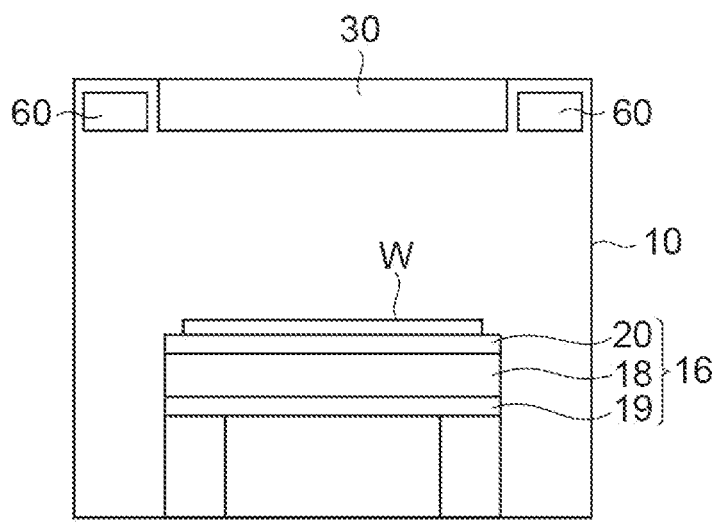
FIGS. 7A, 7B, and 7C schematically illustrate a plasma processing apparatus according to still another exemplary embodiment.
Figure 7B:
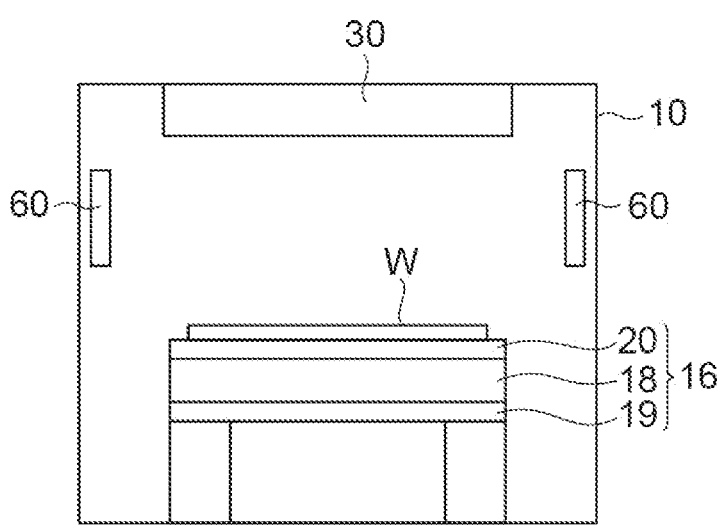
Figure 7C:
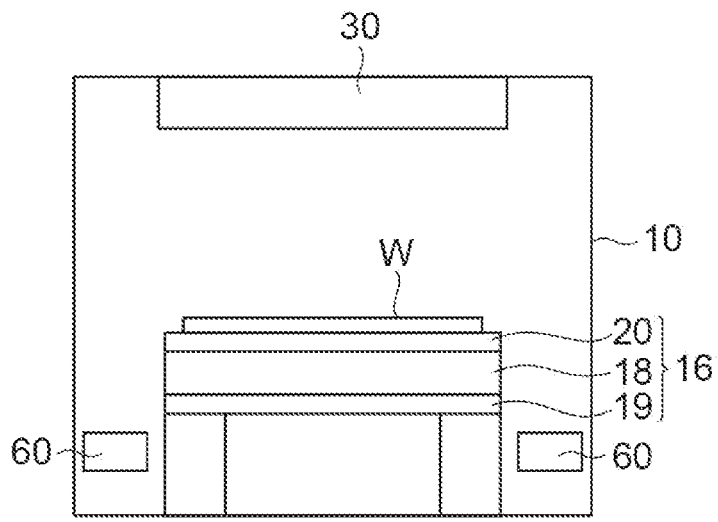

Hereinafter, FIGS. 7A, 7B, and 7C will be referred to. Each of FIGS. 7A, 7B, and 7C is a diagram schematically showing a plasma processing apparatus according to still another exemplary embodiment. As shown in FIGS. 7A, 7B, and 7C, the member 60 may be a member separate from the upper electrode 30. As shown in FIG. 7A, the member 60 may extend in the circumferential direction around the upper electrode 30. As shown in FIG. 7B, the member 60 may extend in the circumferential direction to surround the plasma that is generated between the upper electrode 30 and the substrate support 16. The member 60 may be the side wall of the chamber 10 (for example, the side wall of the chamber body 12) or a part thereof, or may be a member separate from the side wall of the chamber 10. As shown in FIG. 7C, the member 60 may extend in the circumferential direction in an exhaust path that includes a space around the substrate support 16. The member 60 may be the baffle member 48, or may be a member separate from the baffle member 48.

Hereinafter, a plasma processing method according to an exemplary embodiment will be described by taking a case where the plasma processing apparatus 1 or the plasma processing apparatus 1B is used as an example. In the following description, FIGS. 2, 4, and 6 will be referred to. The plasma processing method includes generating plasma from the gas in the chamber 10. The plasma is generated from the gas in the chamber 10 by supplying the radio frequency power HF from the radio frequency power source 61.

The plasma processing method further includes applying a positive voltage from the second power source (the power source 64) in the period PA. As described above, the period PA is a period that is a part of the whole period in which the electric bias EB that is output from the first power source (the bias power source 62 or the bias power source 62B) to the lower electrode 18 has a potential equal to or higher than the average potential of the electric bias EB within the cycle CY thereof. The period PA is, for example, a period in which the electric bias EB that is output from the first power source (the bias power source 62 or the bias power source 62B) to the lower electrode 18 has 0 or a positive potential.

The plasma processing method includes outputting the electric bias EB having a positive potential from the first power source (the bias power source 62 or the bias power source 62B) to the lower electrode 18 in the period PP after the period PA.

As described above, in the period PT, the supply of the radio frequency power HF may be stopped or the power level of the radio frequency power HF may be reduced. The period PT includes at least the period from the point in time of start of the period PA to the point in time between the point in time of start time and the point in time of end of the period PP.

While various exemplary embodiments have been described above, various additions, omissions, substitutions and changes may be made without being limited to the exemplary embodiments described above. Elements of the different embodiments may be combined to form another embodiment.

For example, in another embodiment, the plasma processing apparatus may include a plasma generator different from a capacitively coupled plasma generator. That is, in another embodiment, the plasma processing apparatus may include an inductively coupled plasma generator, an electron cyclotron resonance (ECR) type plasma generator, or a plasma generator using surface waves such as microwaves.

From the foregoing description, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A plasma processing apparatus comprising:
a chamber;
a substrate support having a lower electrode and provided in the chamber;
a plasma generator configured to generate plasma from a gas in the chamber;
a member disposed to be exposed to the plasma generated in the chamber;
a first power source electrically connected to the lower electrode;
a second power source electrically connected to the member; and
a controller configured to
control the plasma generator to generate the plasma from the gas in the chamber;
control the first power source to periodically generate an electric bias having a waveform cycle that includes a first period and a second period after the first period;
control the second power source to apply a positive voltage to the member;
control the second power source to apply the positive voltage to the member in the first period within the waveform cycle, the first period being a part of a whole period in which the electric bias that is output from the first power source to the lower electrode has a potential equal to or higher than an average potential of the electric bias within the waveform cycle; and
control the first power source to output the electric bias having a positive potential to the lower electrode in the second period within the waveform cycle.

2. The plasma processing apparatus according to claim 1, wherein the controller is configured to control the plasma generator to stop supply of radio frequency power for plasma generation in the chamber or reduce a power level of the radio frequency power, at least in a period from a point in time of start of the first period to a point in time between a point in time of start and a point in time of end of the second period.

3. The plasma processing apparatus according to claim 1, wherein a potential of the member in the first period is higher than a potential of the lower electrode in the first period.

4. The plasma processing apparatus according to claim 1, wherein the controller is configured to control the first power source to output the electric bias having a positive potential higher than a potential of the electric bias in the first period to the lower electrode in the second period.

5. The plasma processing apparatus according to claim 1, wherein the plasma processing apparatus is a capacitively coupled plasma processing apparatus.

6. The plasma processing apparatus according to claim 4, further comprising an upper electrode provided above the substrate support,
wherein the member is the upper electrode.

7. The plasma processing apparatus according to claim 1, wherein the controller is configured to control the first power source to periodically output a pulsed direct-current voltage or any voltage waveform as the electric bias.

8. The plasma processing apparatus according to claim 1, wherein the controller is configured to control the first power source to output radio frequency power as the electric bias.

9. The plasma processing apparatus according to claim 2, wherein a potential of the member in the first period is higher than a potential of the lower electrode in the first period.

10. The plasma processing apparatus according to claim 9, wherein the controller is configured to control the first power source to output the electric bias having a positive potential higher than a potential of the electric bias in the first period to the lower electrode in the second period.

11. The plasma processing apparatus according to claim 3, wherein the controller is configured to control the first power source to output the electric bias having a positive potential higher than a potential of the electric bias in the first period to the lower electrode in the second period.

12. The plasma processing apparatus according to claim 1, wherein
the controller is configured to control the first power source to output the electric bias having the positive potential to the lower electrode in the second period to draw negative ions to a substrate on the substrate support.

13. The plasma processing apparatus according to claim 1, wherein
a time length of the first period is 1 μsec or less.

14. The plasma processing apparatus according to claim 1, wherein a time length of the second period is 0.05 μsec or more and 5 μsec or less.

* * * * *